United States Patent [19]

Bagley

[11] E Patent Number: Re. 32,040

[45] Reissued Date of Patent: Nov. 26, 1985

[54] CALCULATOR APPARATUS WITH ELECTRONICALLY ALTERABLE KEY SYMBOLS

[75] Inventor: Alan S. Bagley, Los Altos Hills, Calif.

[73] Assignee: Hewlett-Packard Company, Palo Alto, Calif.

[21] Appl. No.: 124,418

[22] Filed: Feb. 25, 1980

Related U.S. Patent Documents

Reissue of:

[64] Patent No.: 4,078,257
Issued: Mar. 7, 1978
Appl. No.: 716,867
Filed: Aug. 23, 1976

[51] Int. Cl.[4] ..... G06F 3/02; G06F 7/38

[52] U.S. Cl. ..... 364/900; 364/709

[58] Field of Search ..... 364/200, 900, 709; 340/365 R, 365 S, 712; 200/5 R, 159 B; 235/145 R

[56] References Cited

U.S. PATENT DOCUMENTS

| | | | |
|---|---|---|---|
| 3,158,317 | 11/1964 | Alexander . | |
| 3,187,321 | 6/1965 | Kameny | 364/900 X |
| 3,394,368 | 7/1968 | Carr et al. | 340/365 R |
| 3,670,322 | 6/1972 | Mallebrein | 340/365 X |
| 3,760,360 | 9/1973 | Reynolds et al. | 340/166 R |
| 3,772,685 | 11/1973 | Masi | 340/365 C |
| 3,777,222 | 12/1973 | Harris | 340/365 S X |
| 3,855,641 | 12/1974 | Stockwell | 235/156 |
| 3,911,424 | 10/1975 | Giannuzzi et al. | 340/324 R |
| 3,934,242 | 1/1976 | Mueller | 340/324 R |
| 3,934,247 | 1/1976 | Mueller | 340/324 R |
| 3,956,745 | 5/1976 | Ellis | 340/365 R X |
| 4,002,892 | 1/1977 | Ziellnski | 235/156 |

FOREIGN PATENT DOCUMENTS

| | | |
|---|---|---|
| 1172222 | 8/1965 | United Kingdom . |
| 1337963 | 11/1969 | United Kingdom . |
| 1344649 | 12/1971 | United Kingdom . |
| 1365795 | 12/1971 | United Kingdom . |
| 1385416 | 2/1972 | United Kingdom . |
| 1435265 | 10/1974 | United Kingdom . |

*Primary Examiner*—James D. Thomas
*Assistant Examiner*—David Y. Eng
*Attorney, Agent, or Firm*—Jeffery B. Fromm; Allston L. Jones

[57] ABSTRACT

A calculator system having a transparent keyboard includes an apparatus for electronically labeling the keyboard by displaying alphanumeric symbols through the keyboard. The apparatus comprises a keyboard selection device and a liquid crystal keyboard display device having a predetermined number of display planes each containing preselected symbols. The keyboard selection device operates both as a selection device and as an annunciator-feedback device, for selecting the symbols or legends of a given plane to label or configure the keyboard, and for feeding back to a user of the system the status of the selection device when it is activated. An alternative embodiment of the invention utilizes light-emitting diodes (LED's) for labeling the keyboard.

10 Claims, 11 Drawing Figures

CALCULATOR APPARATUS WITH ELECTRONICALLY ALTERABLE KEY SYMBOLS

Matter enclosed in heavy brackets [ ] appears in the original patent but forms no part of this reissue specification; matter printed in italics indicates the additions made by reissue.

BACKGROUND OF THE INVENTION

The present invention relates generally to keyboard apparatus and more particularly to calculator keyboard apparatus. The number of different functions performed by a calculator is limited by the number of keyboard configurations available to the user. Each configuration represents a combination of different keys of the keyboard. A key may be used for as many different functions as there are labels or physical marks upon it or near it identifying the key. It is often difficult, however, to establish more than three such marks on or near a key to identify it for multiple use. To significantly increase the number of functions that may be performed by a key, therefore, it is desirable to be able to mark or identify the key with many labels.

SUMMARY OF THE INVENTION

Thus, in accordance with the illustrated preferred embodiment of the present invention, a calculator apparatus is disclosed having a keyboard with a transparent portion, keyboard-selection keys comprising a keyboard function key and numeric keys that provide feedback of an activated state when activated, and a keyboard display having a plurality of keyboard configurations of alphanumeric symbols.

In selecting a keyboard configuration, a user starts the selection process by activating the keyboard function key, after which he activates, for example, two numeric keys to specify the number of the desired configuration. The calculator selects a configuration by matching the configuration number with a configuration of the alphanumeric symbols, and labels the keyboard by displaying the selected configuration, having only the symbols of that configuration visible when viewed through the transparent portion of the keyboard. The invention thus provides a way of electronically labeling and relabeling a limited set of keys to access a large number of functions that may be programmed into the calculator.

DESCRIPTION OF THE PREFERRED EMBODIMENT

Figure 1:
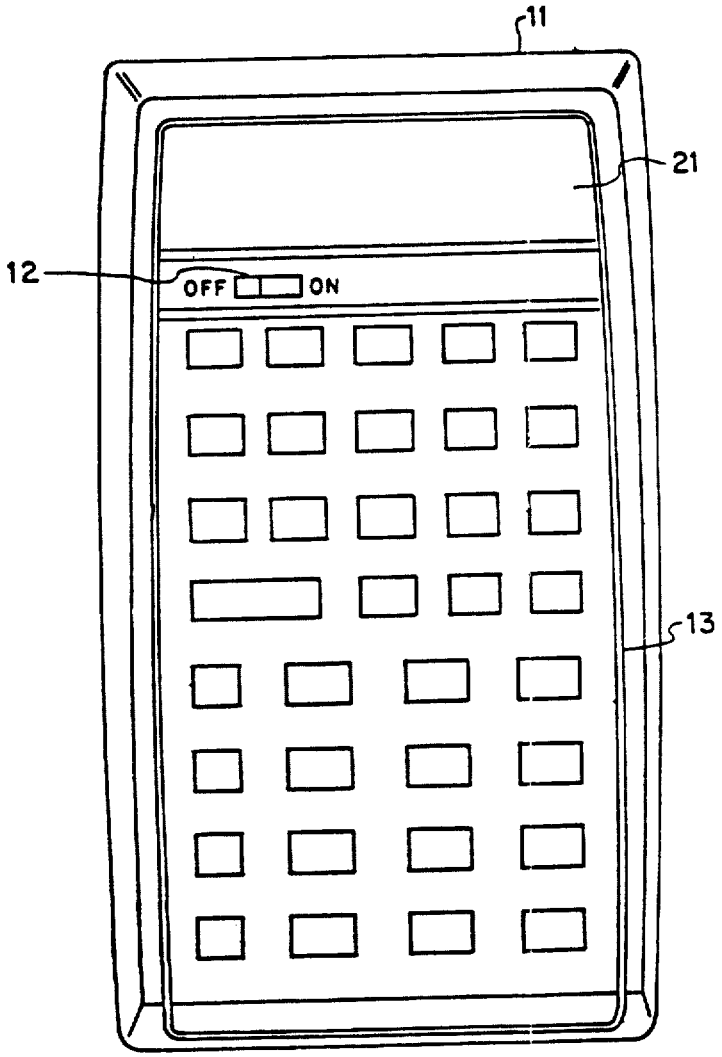
Figure 1 PRIOR ART
FIG. 1 is a front view of a conventional electronic calculator.
Figure 2:
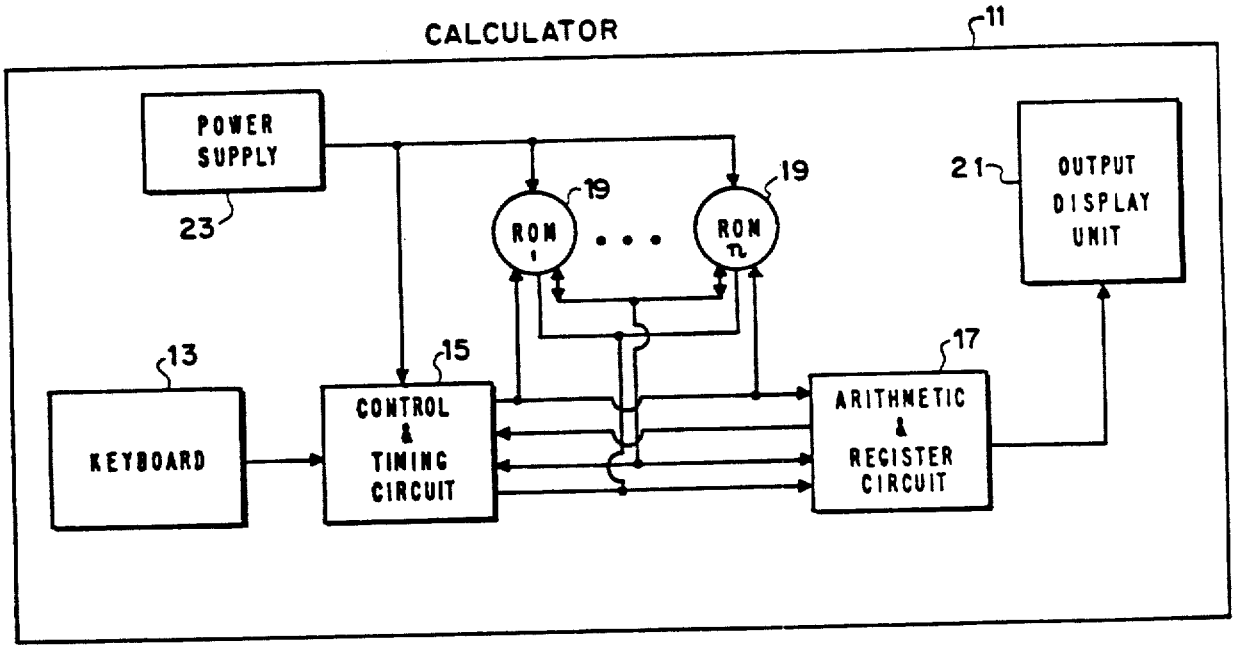
Figure 2 PRIOR ART
FIG. 2 is a block diagram of the calculator of FIG. 1.

Referring to FIG. 1, there is represented a conventional electronic calculator 11 having an on-off switch 12, a keyboard 13 for entering instructions and data into the calculator 11, and an output display unit 21. As shown in FIG. 2, calculator 11 also includes a control and timing circuit 15, an arithmetic and register circuit 17, at least one read-only memory (ROM) 19, and a power supply 23. Except for the construction of the keyboard 13 and a keyboard-labeling program stored in ROM 19, the calculator and the aforementioned elements thereof may be constructed and operated in the same manner shown and described in detail in U.S. Pat. No. 3,863,060 entitled, "General Purpose Calculator With Capability For Performing Interdisciplinary Business Calculations," issued Jan. 28, 1975 to France Rode, et al., and incorporated by reference herein (see, for example, FIGS. 2 and 5, and the associated descriptions thereof in the referenced patent).

Figure 3:
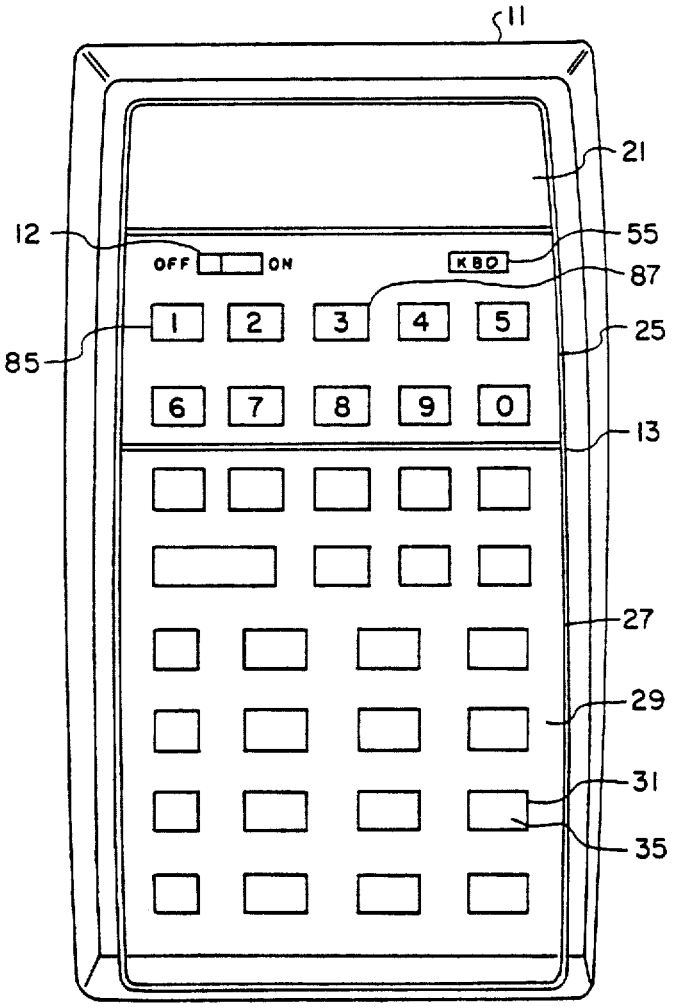
FIG. 3 is a front view of a keyboard with a transparent-key portion employed in the calculator of FIG. 1 in accordance with the preferred embodiment of this invention.

Referring now to FIG. 3, there is shown a key-studded keyboard 13 employed in the calculator 11 of FIG. 1 in accordance with the preferred embodiment of this invention. Keyboard 13 comprises an opaque portion 25 and a transparent-key portion 27. The opaque portion 25 which includes an on-off key 12 and numeric keys labeled 0–9 may be molded from any opaque plastic material such as Acrylonitrile Butadiene Styrene (ABS) material. The transparent-key portion 27 is molded as indicated in FIGS. 3 [an] *and* 4(A) having an opaque portion 29 with a matrix of apertures or windows 31 and a layer of transparent plastic material 33 that fills the apertures 31 to form transparent keys or domes 35.

Figure 4A:
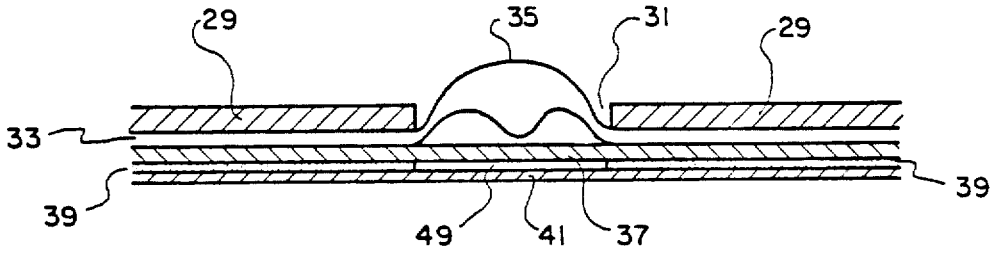
FIGS. 4(A) and (B) are cutaway side views of a key of the keyboard of FIG. 3 showing the key in a non-activated state and in an activated state, respectively.
Figure 4B:
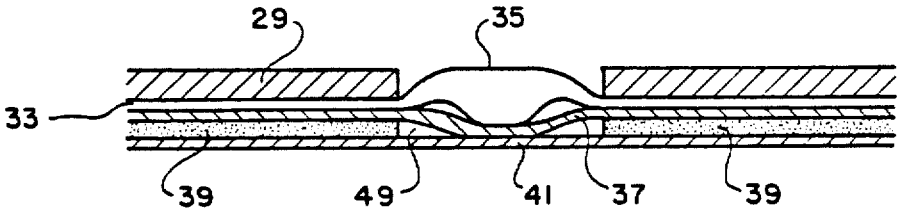
Figure 5:
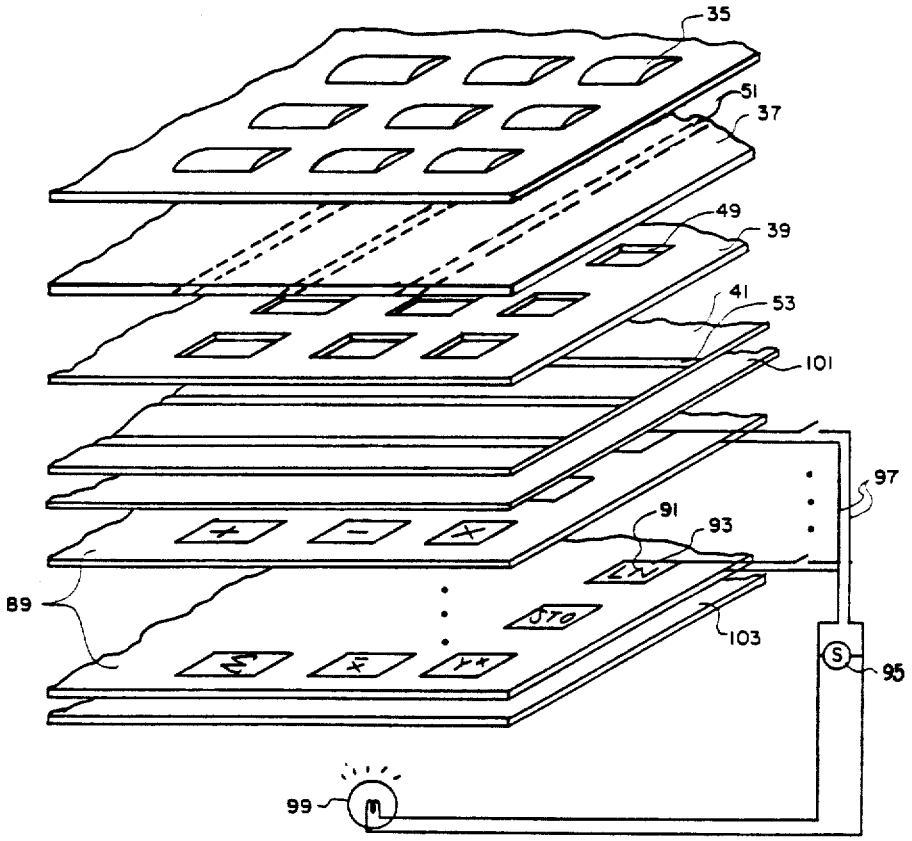
FIG. 5 is an isometric view of transparent layers of the keyboard of FIG. 3 having transparent conductive parts and liquid crystal alphanumeric symbols.

Located beneath layers 29 and 33 are transparent plastic layers 37 and 41, and opaque plastic insulator layer 39. Layer 39 separates an insulates layer 37 from layer 41. Layer 37 is flexible and "gives" when pressed; layer 41 is rigid and does not "give" when pressed. As shown in FIG. 5, insulator layer 39 comprises a matrix of uniformly-spaced windows 49 and layers 37 and 41 comprise uniformly-spaced transparent conductive strips 51 and 53. Strips 51 and 53 may be thin films of metal or metal oxide with low electrical resistance, vacuum deposited on layers 37 and 41 with sufficient thinness as to appear transparent. Strips 51 of layer 37 are orthogonally disposed with respect to the strips 53 of layer 41; strips 51 run column-wise while strips 53 run row-wise. FIGS. 4(B) and 5 show that when a key 35 is pressed, it pushes down a portion of flexible layer 37 through a window 49 of insulator layer 39. This causes a column strip 51 [embedded in layer 37] to make contact with and intersect a row strip 53 [embedded in layer 41], thereby permitting current flow along the intersecting strips 51 and 53. *Alternatively to the conductive strips 51 and 53 being vacuum deposited on the layers 37 and 41, they may be formed by embedding metal or metal oxide in the layers.*"

Figure 6:
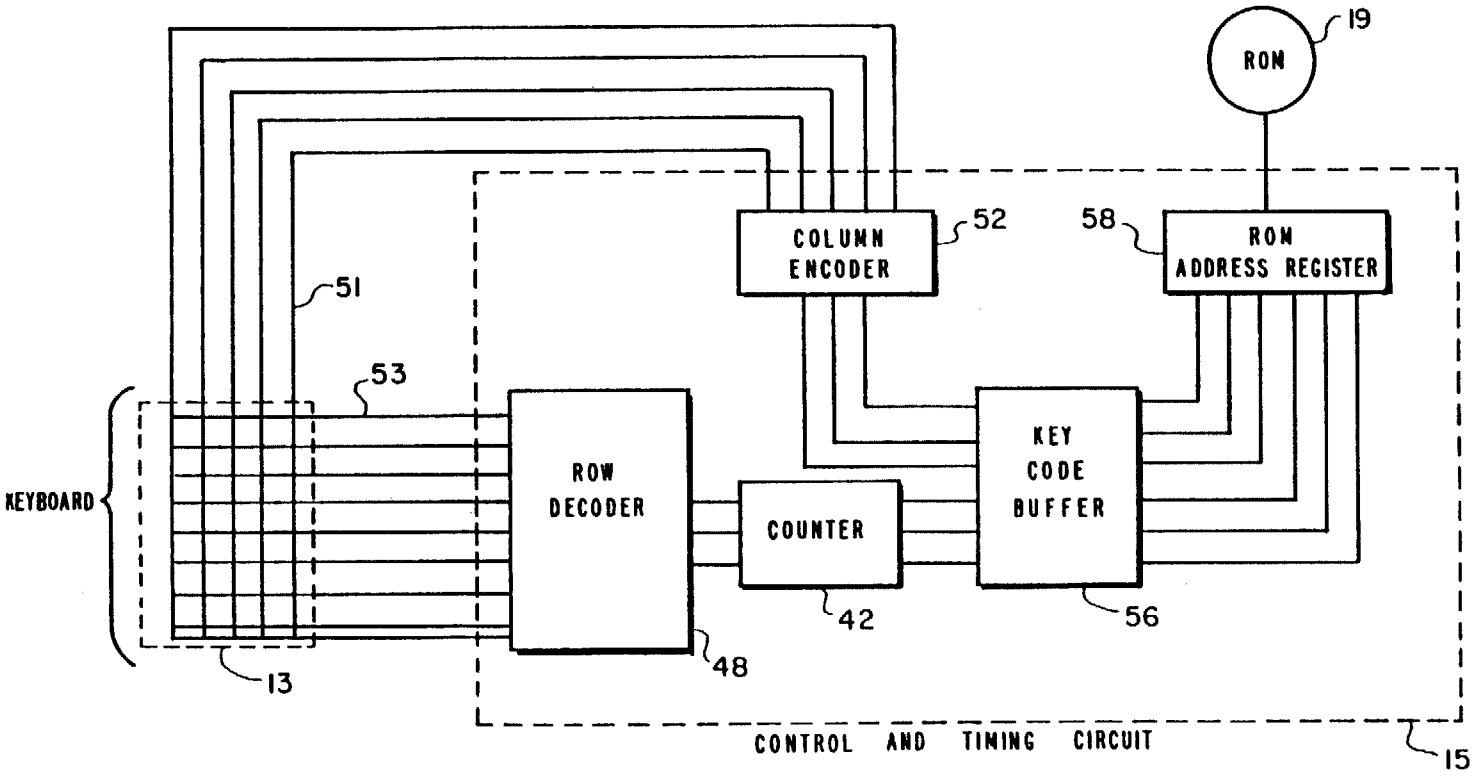
FIG. 6 is a block diagram of a circuit of the calculator of FIG. 3 for decoding keyboard entries.
Figure 7:
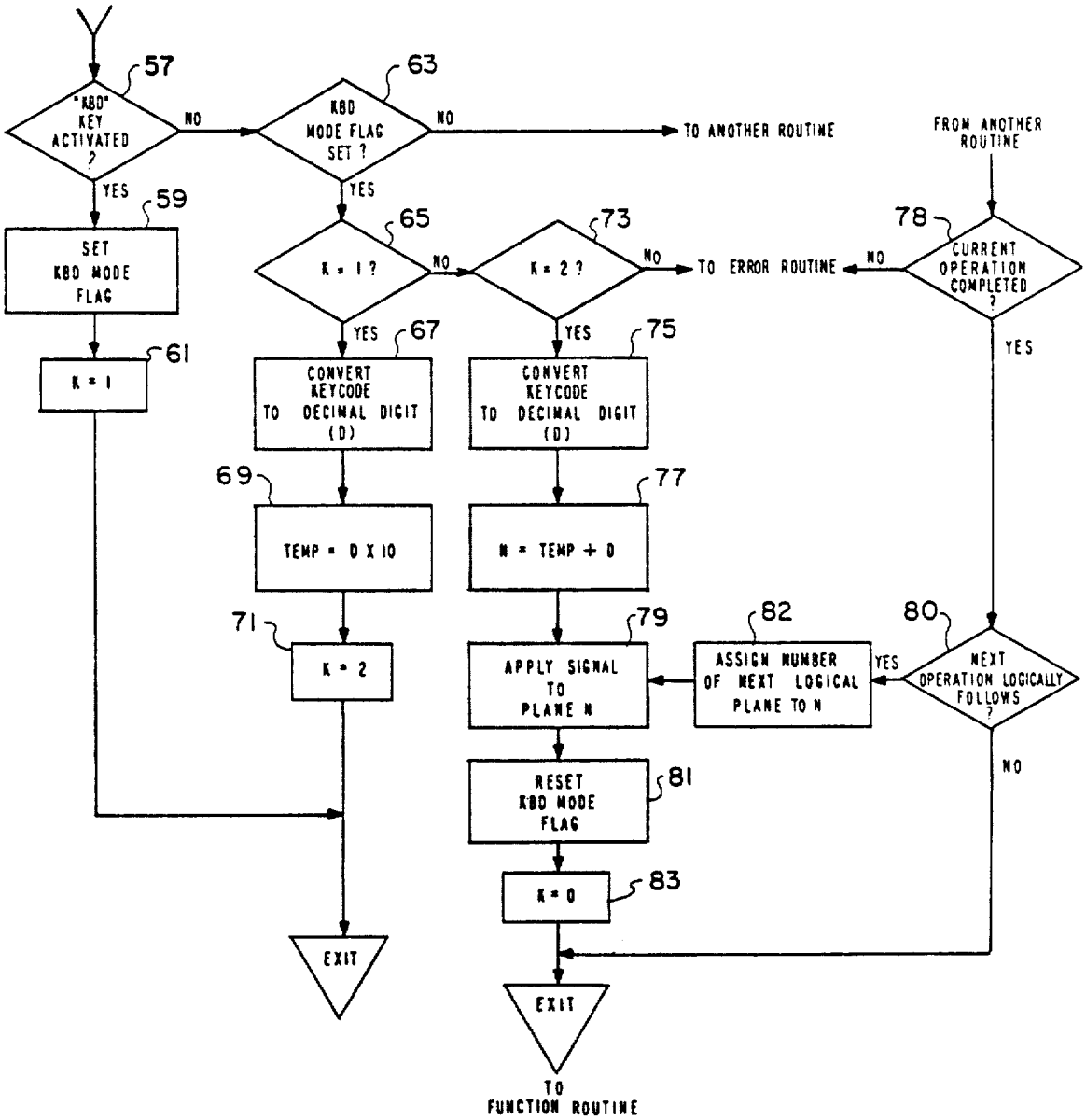
FIG. 7 is a logic flow diagram of a keyboard selection and labeling routine stored in a ROM of the calculator of FIG. 3.

As shown in FIG.6, when a user activates a key, the control and timing circuit 15 scans the matrix of keys of the keyboard 13, row by row, in search of the activated key. In the scanning operation, the contents of count of a 3-bit counter 42 of circuit 15 is applied to a row decoder coder 48 of the same circuit for indicating or specifying the rows to be scanned. As the counter 42 is incremented, the row decoder 48 consecutively selects a next row to be scanned, and scans that row by applying a signal to a conductive strip 53 constituting that row. This is done until all rows are selected, following which the count of 42 is restarted and the selection process is repeated. When a key is activated causing the intersection of a column strip 51 with a selected row strip 53, therefore, this results in the switching of the applied signal from a row strip 53 along an intersecting column strip 51 to column encoder 52 of circuit 15. The column encoder 52 encodes the applied signal into three bits identifying the column containing the activated key. These three bits and three bits of counter 42 together define the key code or location (column and row coordinated, respectively) of the activated key. The contents of counter 42 and of encoder 52 are then saved in key code buffer 56 of circuit 15. The contents of this buffer 56 are transferred to a ROM address register 58 of circuit 15 and become the starting address of a keyboard selection routine stored in ROM 19. A flow chart of this routine is shown in FIG. 7.

In utilizing this routine to select a keyboard configuration, the user first depresses or activates a keyboard selection (KBD) key 55, as shown in FIG. 3, to place the calculator in keyboard-selection mode, after which he activates one or more of the numeric keys to specify the particular keyboard configuration desired. According to the preferred embodiment of the present invention, the user enters a two-digit number to specify up to 100 (00–99) different keyboard configurations. Thus, as indicated in FIGS. 6 and 7, when KBD key 55 (FIG. 3) is activated, the key code of this key is saved in buffer 56 and becomes the starting address of the keyboard selection routine. As indicated in block 57 of the flow chart of this routine, a test is first made by arithmetic and register circuit 17 (FIG. 2) to determine if the key code is that of KBD key 55. If not, control is transferred to block 65.

If the key code is a KBD key code indicating that the KBD key 55 has been activated, an internal flag is set as shown by block 59 placing the calculator in a "keyboard-selection mode" and enabling a user to enter the number of the keyboard configuration he selects. A counter (K) is then set to 1 as indicated by block 61, after which exit is made from the routine. Following the activating of the KBD key 55, the user then enters a first numeric digit by activating one of the numeric keys marked 0–9. This causes the keyboard selection routine to be re-executed, with control being transferred from block 57 to bloc 63 of the routine. Thereafter, because the KBD mode flag was previously set at block 59 and because the variable K was previously set to 1 at block 61, control is transferred from block 63 to block 65 and then to block 67. At block 67 the key code is converted to a decimal digit (D) corresponding to the mark or physical label of the key. This conversion may be performed, for example, by "table look-up", utilizing Table 1 shown below.

TABLE 1

| Key Label | Key Code Row | Key Code Column | Decimal Digit (D) |
|---|---|---|---|
| 1 | 2 | 1 | 1 |
| 2 | 2 | 2 | 2 |
| 3 | 2 | 3 | 3 |
| 4 | 2 | 4 | 4 |
| 5 | 2 | 5 | 5 |
| 6 | 3 | 1 | 6 |
| 7 | 3 | 2 | 7 |
| 8 | 3 | 3 | 8 |
| 9 | 3 | 4 | 9 |
| 0 | 3 | 5 | 0 |

Blocks 69 and 71 show that after the key code is converted to a first decimal digit, the digit is stored as a 10's digit number (e.g., 1 is stored as 10) in a temporary location (TEMP) of ROM 19, after which the counter K is incremented to 2 and an exit is made from the routine. The routine is re-executed when the user enters second decimal digit by activating a second numeric key. This causes control to be transferred from block 57 to block 63 of the routine. Thereafter, control is transferred to block 75 via blocks 63, 65 and 73. Control is transferred from block 63 to block 65 because the KBD mode flag that was previously set at block 59 is still set. Control is transferred from block 65 to block 73 and then to block 75 because the value of counter K is 2 having been set to that value previously at block 71.

At block 75 the key code of the second activated numeric key is converted to a decimal digit (D) and this decimal digit is added, at block 77, to the number stored in location TEMP of ROM 19 to produce a two-digit decimal number N. For example, if, after activating the KBD key 55 (FIG. 3) the user activates numeric key "1" 85 (FIG. 3) and then numeric key "3" 87 (FIG. 3), the number N formed at block 77 would be 13. This is accomplished as follows. Activation of numeric key "1" causes the key code 2-1 shown in Table 1 to be converted by the keyboard selection routine to the value 10. Thereafter, activation of numeric key "3" causes a key code 2-3 to be converted to the value 3 and added to the value 10, thereby producing the value 13.

After the number N is calculated, the operation represented by block 79 is performed, causing a signal to be applied to the Nth plane of the liquid crystal planes (FIG. 5), and to the individual liquid crystal symbols 91 (FIG. 5) embedded in that plane, thereby labeling each transparent key 35 above the symbols. Subsequently, as blocks 81 and 83 show, the KBD mode flag and counter K are reset to permit regular use (i.e., non-labeling) of the keyboard until such time as the KBD key is again activated. After the operation at block 83 is performed, exit is made from the routine. Thereafter, whenever the user activates one of the labeled keys, the calculator transfers control to a "function routine" for performing the particular function or operation indicated by the label of the activated key. In transferring control to the function routine, the calculator first determines the ROM address of the function routine and then transfers control to that address. In determining the ROM address, the calculator utilizes both N and key code values, the key codes identifying the coordinates of the activated key and N identifying the plane containing the label of the activated key.

Blocks 78, 80 and 82 show that whenever the use of a different keyboard configuration logically follows the use of a prior configuration, the calculator automatically selects the subsequent configuration after the operations associated with the prior configuration are completed. For example, if the operations associated with the sixth keyboard configuration are completed and the operations associated with the ninth keyboard configuration must logically be performed next, the calculator assigns the new value of 9 to N and, as block 79 shows, displays the next keyboard configuration by applying an appropriate signal to plane nine.

Figure 8:
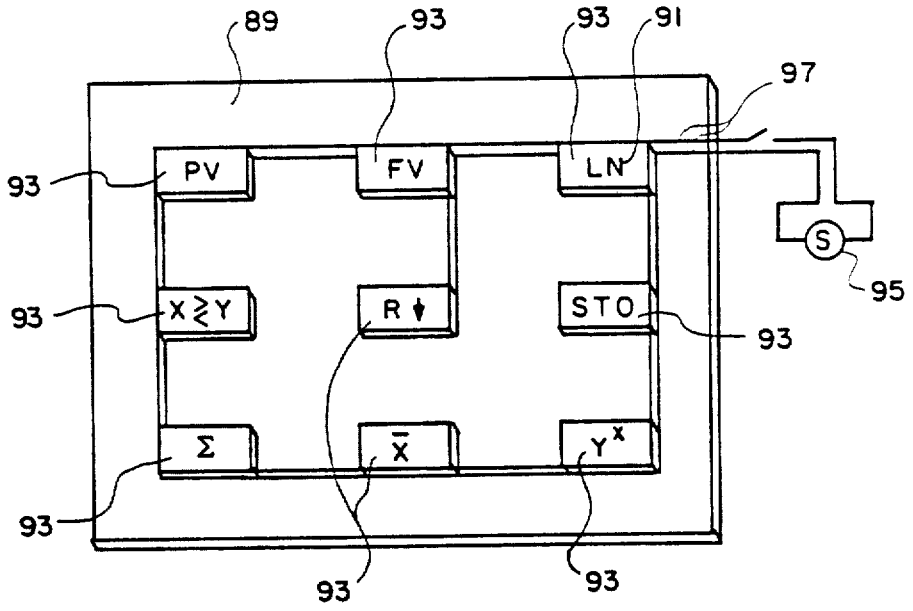
FIG. 8 is a top view of a layer of the keyboard of FIG. 5 showing a circuit with substantially transparent electrodes for applying an electric field in areas containing the liquid crystal symbols.

In the illustrated embodiment of FIG. 8, electric field zones 93 are shown within which are enclosed hollow areas filled with liquid crystal material such as cholesteric liquid crystals in the shape of different alphanumeric symbols 91. Electric field zones 93 are used to produce an opaque or otherwise discernable image of the liquid crystal material 91 when the material is viewed through transparent keys 35. Such a use of an electric field zone 93 is well documented in the literature (see, for example, FIG. 2(d) and accompanying description of U.S. Pat. No. 3,718,380, issued Feb. 27, 1973 to J. J. Wysocki, et al.). In the referenced patent, an electric field, which is created by the application of an electric signal from a signal source along transparent electrodes, is employed to produce an opaque image of a symbol when light from a light source is transmitted through the liquid crystal material and through orthogonally-oriented polarizers.

An alternative construction, as depicted in FIG. 2(b) or 2(c) of the above referenced patent, utilizes reflected ambient light and obviates the need for polarizers and for a light source. Such an alternative construction is also employable in applicant's invention, provided both electrodes 97 (FIG. 5) are transparent and provided polarizers 101, 103 and light source 99 are omitted.

Figure 9A:
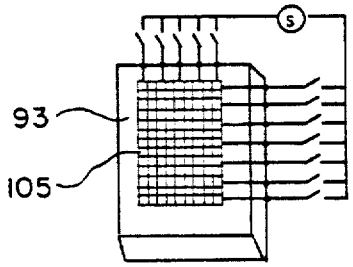
FIG. 9(A) is a top view of liquid crystals arranged in X-Y matrix format for forming and displaying symbols when an electric current is applied to selected segments of the matrix.
Figure 9B:
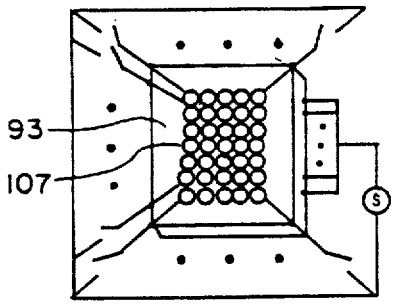
FIG. 9(B) is a top view of liquid crystals or light-emitting diodes (LED's) arranged in dot matrix format for forming and displaying symbols when an electric current is applied to selected segments of the matrix.

Another embodiment of the present invention employs a single plane 89 of transparent plastic material having a plurality of electric field zones 93, each zone 93 comprising a matrix of individual segments of liquid crystals that can be individually addressed and displayed, such as the X-Y segments 105 shown in FIG. 9(A) or dot segments 107 shown in FIG. 9(B). The dot segments 107 shown in FIG. 9(B) may also be light-emitting diode (LED) elements geometrically arranged in matrix format. Such individually addressable matrix segments are described in the literature (see, for example, Edward L. Williams, Liquid Crystals For Electronic Devices, Noyes Data Corporation, Park Ridge, New Jersye, 1975, page 79). To enable such matrix segments 105, 107 as shown in FIGS. 9(a) and 9(B) to be utilized in the keyboard of the present invention, the routine shown in FIG. 7 may be changed so as not to select an Nth plane for display but to select an Nth series of ROM locations. Selection is made from several series of ROM locations, the contents of each series corresponding to the X-Y or dot matrix patterns of the symbols of one keyboard configuration. Symbol patterns are predetermined and prestored in ROM 19.

Other embodiments of the present invention include a keyboard 13 having both sections 25 and 27 (FIG. 3) transparent, or a keyboard with transparent keys that become actuated by induction, for example, a keyboard that enables transparent conductive strip 53 (FIG. 5) of plane 41 to induce a current in transparent strip 51 of plane 37 when strip 51 is brought into close proximity to strip 53, or a keyboard with transparent keys that become actuated by virtue of the capacitance, heat or other physical phenomenon between transparent strip 53 and a proximate transparent strip 51 or a proximate human finger.

A further embodiment of the present invention employs the keyboard-selection (KBD) key 55 as the sole keyboard selection device. Successive keyboard configurations are displayed when the key is successively activated, or when the key is depressed and held down.

When activated, the keys 35 provide a feedback to the user. This feedback may be in the form of a tactile sensation such as, for example, a vibration, a light electrical shock, or a mechanical or "flexible snap-back" action as from the key of FIG. 4(B), or may be in the form of an audible, visual or other sensation.

I claim:

[1. In a data entry system, a keyboard apparatus having at least one keyboard configuration of alphanumeric symbols disposed as energizable elements on at least one plane, said apparatus comprising:

keyboard selection means having a keyboard with at least one labeled key and a plurality of transparent regions with unlabeled keys, said selection means including mode control means responsive to actuation of at least one of the labeled keys for selecting a first and a second mode of operation, and for selecting a keyboard configuration during said first mode, said keyboard selection means including means for selecting one of said planes; and keyboard display means having at least one plane of energizeable elements disposed beneath the keyboard, and coupled to said keyboard selection means for electronically labeling the unlabeled keys during said first mode by energizing selected portions of selected ones of the energizeable elements on a selected plane, in accordance with the selected keyboard configuration and displaying the selected keyboard configuration of alphanumeric symbols through the transparent regions, the electronically labeled keys and selected ones of the labeled keys being actuatable during said second mode for entering information indicated by their labels.]

[2. The keyboard apparatus of claim 1 wherein said keys are disposed for indicating an activated state when activated by a user.]

[3. The apparatus of claim 1 wherein the labeled key of the keyboard selection means is a single keyboard selection key disposed for selecting successive keyboard configurations when said key is successively activated.]

[4. The apparatus of claim 1 wherein the labeled keys of the keyboard selection means includes a labeled keyboard selection key and at least one labeled numeric key for selecting a keyboard configuration, said labeled keyboard selection key being utilized for starting the selection procedure and said numeric keys being utilized for selecting the configuration identified by the numbers of the numeric keys.]

[5. The apparatus of claim 1 wherein said keyboard selection means includes a flexible transparent layer having a first set of substantially transparent conductive strips, a substantially non-flexible transparent layer having a second set of substantially transparent conductive strips orthogonally disposed with respect to said first set, and an insulator layer separating said flexible and non-flexible layers with windows disposed therein for enabling said first set of conductive strips to make contact with said second set of conductive strips through said windows when the keys are activated.]

[6. The apparatus of claim 1 wherein said keyboard selection means includes a processor unit and a read-only memory unit having a keyboard selection routine stored therein for performing the keyboard selection operation indicated by the routine in response to keyboard-selection entries fom the keyboard.]

[7. The apparatus as in claim 6 wherein said read-only memory unit includes a routine stored therein for automatically displaying, in the absence of activation of the keyboard selection key, a preselected keyboard configuration whenever the operations corresponding to said preselected keyboard configuration must logically be performed following the completion of a current operation.]

[8. The apparatus of claim 6 wherein said energizable elements are a plurality of liquid crystals from which selected alphanumeric symbols are displayed by the processor unit under control of said routine, said symbols being viewable through the transparent regions of the keyboard.]

[9. The apparatus of claim 6 wherein said energizeable elements are a plurality of substantially transparent matrices of light-emitting diodes, which, when selectively activated by the processor under control of said routine, form symbols that are viewable through the transparent portion of the keyboard.]

[10. A method of electronically labeling a keyboard with at least one keyboard configuration of alphanumeric symbols, the symbols being displayable from at least one substantially transparent plane of energizeable elements, the keyboard having at least one labeled key and a plurality of transparent regions with unlabeled keys, one of said labeled keys being disposed for selecting one of first and second modes of operation, said method comprising the steps of:

selecting a first mode of operation;

selecting a keyboard configuration of alphanumeric symbols during said first mode by selecting one of said transparent planes of energizeable elements; and displaying the selected configuration of alphanumeric symbols through the transparent regions during said first mode to electronically label the unlabeled keys in response to actuation of at least one of the labeled keys, by energizing selected portions of selected ones of the energizeable elements on a selected plane in accordance with the keyboard configuration selected, the electronically labeled keys, and selected ones of the labeled keys being actuatable during said second mode for entering information indicated by their labels.]

[11. The method of claim 10, where the step of selecting a keyboard configuration includes the steps of:

activating at least one labeled key;

identifying the activated key; and selecting at least a first configuration of alphanumeric symbols in accordance with the identified activated key.]

[12. The method of claim 11, where the step of selecting at least a first configuration includes the steps of determining any subsequent configuration which logically follows said first configuration and which is logically displayable following said first configuration, and automatically selecting said subsequent configuration for display.]

[13. The method of claim 10 where the step of displaying includes the step of electronically labeling the unlabeled keys in response to each activation of a key.]

[14. The method of claim 10 where the step of displaying includes the step of electronically labeling the unlabeled keys, producing different keyboard configurations during the interval that a key is activated and held down in a depressed position.]

15. A keyboard having at least one keyboard configuration of alphanumeric symbols disposed as energizeable elements on at least one plane, said keyboard being responsive to means for selecting at least two modes of operation, means for selecting a keyboard configuration by energizing selected ones of the elements [on a selected plane], and means for displaying the selected configuration, said keyboard comprising:

a cover portion with at least one labeled key and a plurality of transparent unlabeled key regions, the *at least one* labeled key being disposed [for initiating the selection of one of the two modes of operation and] for initiating the selection of a configuration of alphanumeric symbols during a first mode, to electronically label the unlabeled key regions;

a conductive portion disposed below said cover portion and having a first transparent portion located below said transparent unlabeled key regions; and a display portion disposed below said conductive portion and having a second transparent portion located below said first transparent portion, said second transparent portion having at least one substantially transparent plane with the plurality of energizeable elements for producing and displaying through said transparent regions and portions at least one configuration of alphanumeric symbols to electronically label, during said first mode, the unlabeled key regions in accordance with the selected configuration, the electronically labeled key regions and the labeled keys being actuatable during a second mode for making keyboard entries indicated by their labels.

16. The keyboard as in claim 15 wherein said labeled key and unlabeled key [regions are disposed for indicating] *can indicate* an activated state when activated by a user.

17. The keyboard as in claim 16 wherein said conductive portion includes a flexible transparent layer having a first set of substantially transparent conductive strips, a substantially non-flexible transparent layer having a second set of substantially transparent conductive strips orthogonally disposed with respect to said first set, and an insulator layer separating said flexible and non-flexible layers with windows disposed therein for enabling said first set of conductive strips to make contact with said second set of conductive strips through said windows when *the unlabeled* keys are activated *by a user.*

18. The keyboard as in claim 15 wherein the energizeable elements are liquid crystal elements.

19. The keyboard as in claim 15 wherein the energizeable elements are substantially transparent matrices of light-emitting diodes.

*20. A keyboard having at least one keyboard configuration of alphanumeric symbols disposed as energizeable elements on at least one plane, said keyboard being responsive to means for selecting at least two modes of operation, means for selecting a keyboard configuration by energizing selected ones of the elements and means for displaying the selected configuration, said keyboard comprising:*

*a cover portion with at least one labeled key and a plurality of transparent unlabeled key regions, the at least one labeled key being disposed for initiating the selection of a configuration of alphanumeric symbols during a first mode, to electronically label the unlabeled key regions;*

*a conductive portion disposed below said cover portion and having a first transparent portion located below said transparent unlabeled key regions; and*

*a display portion disposed below said conductive portion and having a second transparent portion located below said first transparent portion, said second transparent portion having at least one substantially transparent plane with the plurality of energizable elements for producing and displaying through said transparent regions and portions at least one configuration of alphanumeric symbols, the electronically labeled key regions and the labeled keys being actuable during a second mode for making keyboard entries indicated by their labels.*

*21. The keyboard as in claim 20 wherein said labeled key and unlabeled key can indicate an activated stated when activated by a user.*

*22. The keyboard as in claim 21 wherein said conductive portion includes a flexible transparent layer having a first set of substantially transparent conductive strips, a substantially non-flexible transparent layer having a second set of substantially transparent conductive strips orthogonally disposed with respect to said first set, and an insulator layer separating said flexible and non-flexible layers with windows disposed therein for enabling said first set of conductive strips to make contact with said second set of conductive strips through said windows when the unlabeled keys are activated by a user.*

*23. The keyboard as in claim 20 wherein the energizeable elements are liquid crystal elements.*

*24. The keyboard as in claim 20 wherein the energizeable elements are substantially transparent matrices of light-emitting diodes.*

* * * * *

UNITED STATES PATENT AND TRADEMARK OFFICE

CERTIFICATE OF CORRECTION

PATENT NO. : Re. 32,040

DATED : November 26, 1985

INVENTOR(S) : Alan S. Bagley

It is certified that error appears in the above-identified patent and that said Letters Patent is hereby corrected as shown below:

Column 2, line 52, "layer 39. Layer 39 separates an insulates" should read -- layer 39. Layer 39 separates an insulation --

Column 3, line 9, "key. In the scanning operation, the contents of" should read -- key. In the scanning operation, the contents or --

Column 5, line 26, "an electric signal from a signal" should read -- an electrical signal from a signal --

Column 5, line 52, "segments 105, 107 as shown in FIGS. 9(a)" should read -- segments 105, 107 as shown in FIGS. 9(A) --

Column 10, line 2, "key and unlabeled key can indicate an activated stated" should read -- key and unlabeled key can indicate an activated state --

Signed and Sealed this

*Third* Day of *June 1986*

[SEAL]

*Attest:*

DONALD J. QUIGG

*Attesting Officer*

*Commissioner of Patents and Trademarks*